United States Patent [19]
Dill et al.

[11] Patent Number: 5,661,444
[45] Date of Patent: Aug. 26, 1997

[54] MULTI-CHANNEL, NARROW-BAND SAW FILTER

[75] Inventors: Roland Dill; Jürgen Machui, both of München, Germany

[73] Assignee: Siemens Aktiengesellschaft, Munich, Germany

[21] Appl. No.: 467,572

[22] Filed: Jun. 6, 1995

[30] Foreign Application Priority Data

Jun. 6, 1994 [DE] Germany ............... 44 19 722.5

[51] Int. Cl.$^6$ ............................................. H03H 9/64
[52] U.S. Cl. .................. 333/195; 333/193; 333/196; 310/313 D
[58] Field of Search .................. 333/193–196; 310/313 R, 313 D

[56] References Cited

U.S. PATENT DOCUMENTS

| | | | |
|---|---|---|---|
| 4,609,891 | 9/1986 | Solie et al. | 333/195 |
| 5,128,640 | 7/1992 | Anemogiannis | 333/196 |
| 5,357,228 | 10/1994 | Dufilie | 333/195 |
| 5,426,339 | 6/1995 | Wright | 333/196 |
| 5,475,348 | 12/1995 | Hode et al. | 333/195 |

FOREIGN PATENT DOCUMENTS

| | | |
|---|---|---|
| 57-62616 | 4/1982 | Japan . |
| 0565936 | 3/1993 | Japan . |
| 93/08641 | 4/1993 | WIPO . |

OTHER PUBLICATIONS

Article: 1993 Ultrasonics Symposium, pp. 105–109, (Solal et al.) "A new compact saw low loss filter for mobile radio";

Primary Examiner—Benny Lee
Assistant Examiner—Darius Gambino
Attorney, Agent, or Firm—Herbert L. Lerner; Laurence A. Greenberg

[57] ABSTRACT

A filter operating with acoustical surface waves includes two acoustical paths each having one unidirectional input transducer, one unidirectional output transducer, and a reflector structure disposed between the input and output transducers. The input transducers in the acoustical paths are structurally identical, the output transducers in the acoustical paths are structurally identical, and the input and output transducers in each of the acoustical paths are spaced apart by the same distance. One of the input transducers or the output transducers are electrically connected in phase opposition, and the other of the input transducers or the output transducers are electrically connected in phase. The reflector structures in the two acoustical paths have substantially the same reflection performance, the reflector structure in one of the acoustical paths is shorter than the reflector structure in the other of the acoustical paths by $\lambda/2$, the reflector structures in the two acoustical paths are disposed centrally between the input and output transducers, and $\lambda$ is a wavelength at a mean frequency of the filter.

6 Claims, 3 Drawing Sheets

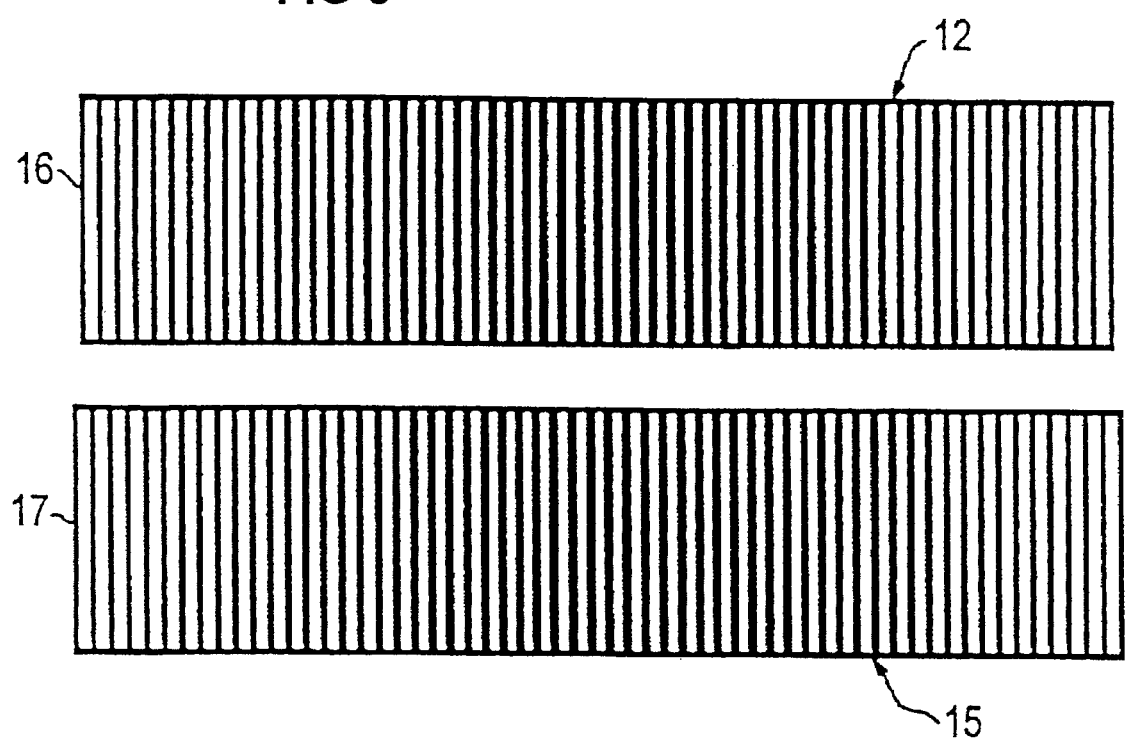

MULTI-CHANNEL, NARROW-BAND SAW FILTER

BACKGROUND OF THE INVENTION

1. Field of the Invention

The present invention relates to a filter operating with acoustical surface waves, a so-called SAW filter, including two acoustical paths each having one unidirectional input transducer, one unidirectional output transducer, and a reflector structure therebetween.

Such SAW filters are known, for instance, from U.S. Pat. No. 5,475,348 to Hode et al and from an article entitled "A New Compact Saw Low Loss Filter for Mobile Radio" in the IEEE 1993 Ultrasonics Symposium, pp. 105–109. The filters involve small filters with low losses, particularly for mobile radio applications. Those filters combine the advantages of low insertion loss, simple tuning, ease of manufacture and small size, which is of great significance especially for mobile telephones.

However, a disadvantage of a known filter of the type described above is that the extinction of the direct transducer to transducer signals is obtained only at the mean frequency of the filter. The result is therefore not only a transmission curve centered at the mean frequency of the filter but also besides that transmission curve still other transmission ranges, which are centered around frequencies differing from the mean frequency of the filter.

2. Summary of the Invention

It is accordingly an object of the invention to provide a filter operating with acoustical surface waves, which overcomes the hereinafore-mentioned disadvantages of the heretofore-known devices of this general type and which improves such a filter in such a way that an extinction of direct transducer to transducer signals is present not only at the mean frequency.

With the foregoing and other objects in view there is provided, in accordance with the invention, a filter operating with acoustical surface waves, comprising two acoustical paths each having one unidirectional input transducer, one unidirectional output transducer, and a reflector structure disposed between the input and output transducers; the input transducers in the acoustical paths being structurally identical, the output transducers in the acoustical paths being structurally identical, and the input and output transducers in each of the acoustical paths being spaced apart by the same distance; one of the input transducers in the two acoustical paths and the output transducers in the two acoustical paths being electrically connected in phase opposition, and the other of the input transducers in the two acoustical paths and the output transducers in the two acoustical paths being electrically connected in phase; and the reflector structures in the two acoustical paths having substantially the same reflection performance, the reflector structure in one of the acoustical paths being shorter than the reflector structure in the other of the acoustical paths by $\lambda/2$, and the reflector structures in the two acoustical paths being disposed centrally between the input and output transducers, wherein $\lambda$ is a wavelength at a mean frequency of the filter.

In accordance with another feature of the invention, the transducers are SPUDTs.

In accordance with a further feature of the invention, the reflector structures have electrode strips with widths, and the reflector structures are weighted by varying the widths of the electrode strips.

In accordance with an added feature of the invention, the reflector structures have electrode strips, and the reflector structures are weighted by shifting positions of the electrode strips.

In accordance with an additional feature of the invention, the reflector structures have electrode strips with widths, and the reflector structures are weighted by a combination of varying the widths and shifting positions of the electrode strips.

In accordance with a concomitant feature of the invention, the reflector structures have electrode strips, and the reflector structures are weighted by omissions of the electrode strips.

Other features which are considered as characteristic for the invention are set forth in the appended claims.

Although the invention is illustrated and described herein as embodied in a filter operating with acoustical surface waves, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic view of an embodiment of reflectors for an SW filter of FIG. 1;

DESCRIPTION OF THE PREFERRED EMBODIMENTS

Figure 4:
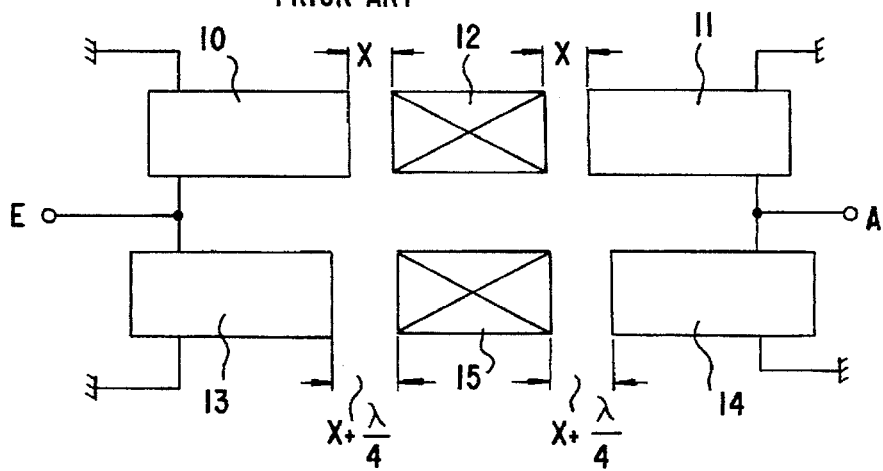
FIG. 4 is a schematic circuit diagram of a known SW filter.

Referring now to the figures of the drawing in detail and first, particularly, to FIG. 4 thereof, there is seen a general layout of an SW filter of the type which is known, for instance, from Published International Application WO 93/08641 and from an article entitled "A New Compact Saw Low Loss Filter for Mobile Radio" in the IEEE 1993 Ultrasonics Symposium, pp. 105–109. As mentioned above, such filters involve small filters with low losses, particularly for mobile radio applications. The filters combine the advantages of low insertion loss, simple tuning, ease of manufacture and small size, which is of great significance especially for mobile telephones. The filter has two acoustical paths, in each of which an input transducer 10 and 13 and an output transducer 11 and 14, are respectively disposed, with a respective reflector structure 12 and 15 between them. The transducers are constructed in particular as so-called SPUDTs (single phase unidirectional transducers). One essential characteristic of such a filter is that an offset from one path to the next between the transducers and the respective reflector differs by $\lambda/4$, where $\lambda$ is the wavelength at the mean frequency of the filter. Such an offset is illustrated in FIG. 4 by the fact that at a spacing X between the transducers 10 and 11 and the reflector 12 in the upper acoustical path, the corresponding spacing in the lower acoustical path is $X+\lambda/4$.

With that kind of structure, the phase offset between the two paths for the direct course between the various transducers and the reflector is 180°. No electrical signal is therefore generated in a non-illustrated load impedance connected to an output A when an electrical input signal is fed to an input E. The transducers behave in accordance with their short-circuited state, and only a single extinguishing acoustical reflection occurs.

After reflection at the reflectors 12, 15, phase equilibrium once again prevails, so that after conversion in the transducers a useful electrical signal is produced.

As is shown in FIG. 3, there is also a dual course, including a reflection at the reflectors 12, 15, a reflection at the transducers 10, 13 and 11, 14, and a transmission by the reflectors 12, 15. As in the first, direct course, the acoustical surface waves in the two paths are in phase opposition, while the acoustical phases reflected by the reflectors and the input and output transducers are in phase.

Two additional selection mechanisms are obtained and therefore a lengthening of the pulse response, from the reflections from the input and output transducers and from the reflectors. In comparison with a SPUDT filter having the same substrate length, the pulse word length can be doubled with the technique described, or the bandwidth can be halved.

However, a disadvantage of a known filter of the type described above is that the extinction of the direct transducer to transducer signals is obtained only at the mean frequency of the filter. The result is therefore not only a transmission curve centered at the mean frequency of the filter but also, besides this transmission curve, even more transmission ranges, which are centered around frequencies differing from the mean frequency of the filter.

Figure 1:
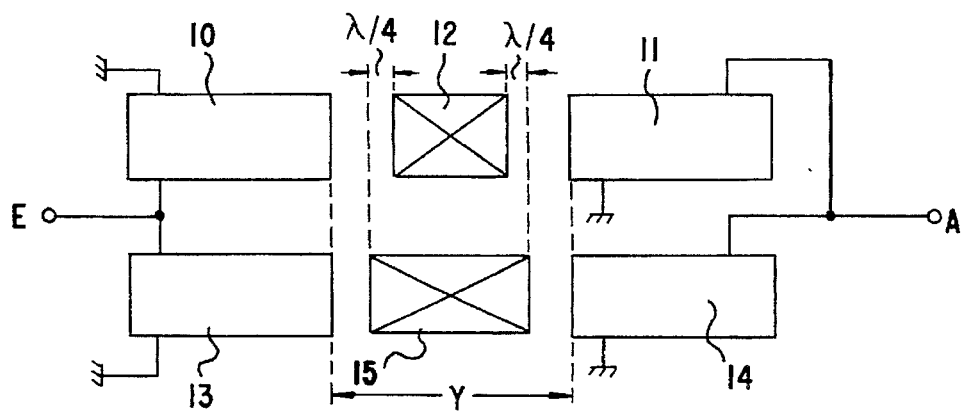
FIG. 1 is a schematic circuit diagram of one embodiment of an SW filter according to the invention.

In FIG. 1, in which elements that are identical to those of FIG. 4 are identified by the same reference numerals, the respective input transducers 10 and 13 and the respective output transducers 11 and 14 in the two acoustical paths are spaced apart by the same distance Y. According to the invention, the respective input transducers 10, 13 and output transducers 11, 14 in the two acoustical paths are also structurally identical, and the input transducers 10, 13 or the output transducers 11, 14 are connected electrically in phase opposition, while the respectively other transducers are connected in phase. FIG. 1 illustrates the case in which the input transducers 10, 13 are in phase opposition, and the output transducers 11, 14 are in phase. From the drawing it is readily apparent that the way in which the transducers are connected can be transposed.

Figure 2:
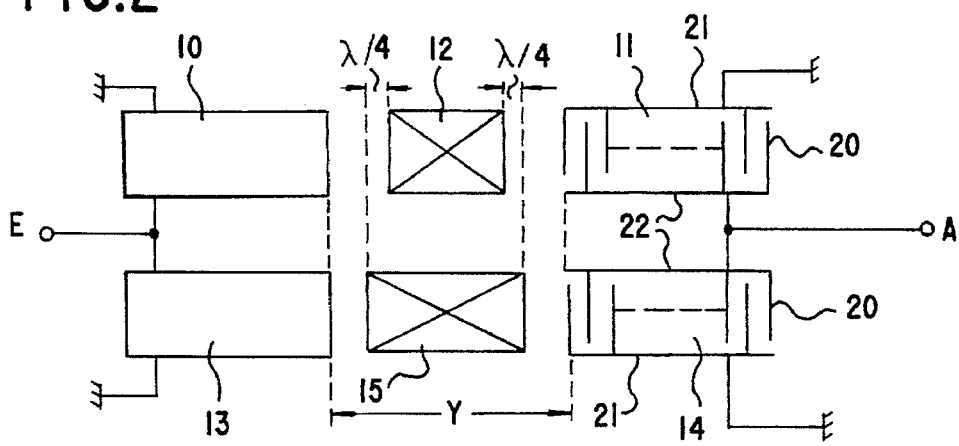
FIG. 2 is a view similar to FIG. 1 of a further embodiment of an SW filter according to the invention.

In the embodiment of FIG. 2, in which elements identical to those of FIG. 1 carry the same reference numerals, a phase opposition or in-phase situation is attained in which once again with structurally identical transducers (10, 11, 13, 14), the transducers 11, 14 on the output side are disposed mutually toward one another. This is schematically illustrated by having interdigitally disposed electrode prongs 20 each originate in an opposite direction at bus bars 21, 22.

The invention also provides for the reflector structures 12, 15 to have essentially the same reflection performance, and for the reflector structure in one path, that is the reflector structure 12 in the embodiments of FIGS. 1 and 2, to be shorter by $\lambda/2$ than the reflector structure in the other path, that is the reflector structure 15 in the embodiments of FIGS. 1 and 2. In the configurations shown in FIGS. 1 and 2, the reflector structure 12 is shorter on opposite sides by $\lambda/4$ than the reflector structure 15, and this is because, in accordance with the invention, the two reflector structures 12, 15 in the two paths are disposed centrally between the respective transducers 10, 11 on one hand and 13, 14 on the other hand.

In another feature of the invention, the transducers 10, 11, 13, 14 are preferably constructed as SPUDTs.

In a further feature of the invention, the reflector structures 12, 15 are weighted reflector structures, and the weighting can be performed by changing the width, shifting the position, changing the width and shifting the position, or omitting electrode strips in the reflector structures.

FIG. 3 shows an embodiment of the reflector structures 12 and 15 of FIGS. 1 and 2, in the form of reflectors with short-circuited electrode strips 16 and 17, and with weighting of the reflectors by changing the width of the electrode strips. For the sake of simplicity, FIG. 3 shows only one respective electrode strip 16 and 17 of a number of electrode strips.

Figure 5:
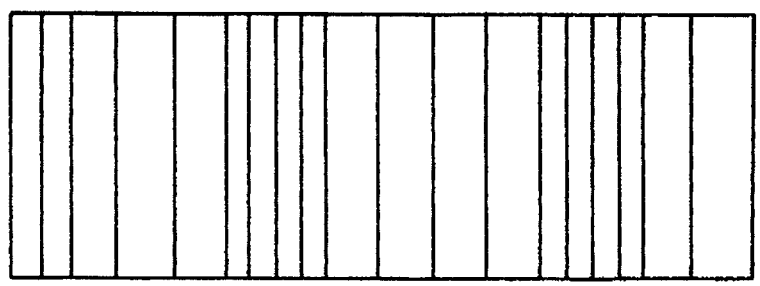
FIG. 5 is a diagrammatic view of a second embodiment of the reflectors for a SAW filter of FIG. 1.

An SW filter according to the invention has the advantages of attractive feasibility, with low insertion loss, simple construction and accurate analysis, very high selection, very slight crosstalk, volume wave suppression, and the possibility of dispensing with a coupling coil between the acoustical paths. FIGS. 5 shows an alternative configuration of the electrode strips. FIG. 5 shows the weighting by a combination of varying the widths and shifting the positions of the electrode strips.

Figure 6:
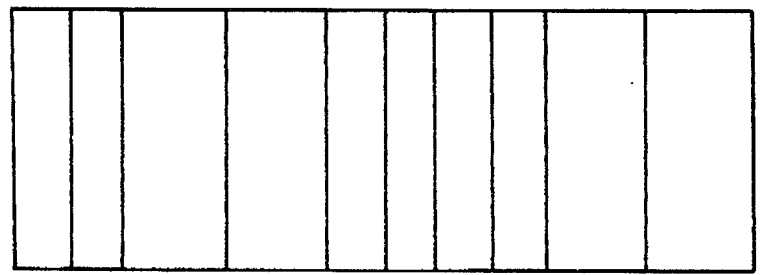
FIG. 6 is a diagrammatic view of a third embodiment of the reflectors for a SAW filter of FIG. 1.

FIG. 6 shows alternative configuration of the electrode strips. FIG. 6 shows the weighting by omissions of some electrode strips.

We claim:

1. A filter operating with acoustical surface waves, comprising:

two acoustical paths each having one unidirectional input transducer, one unidirectional output transducer, and a reflector structure disposed between said input and output transducers;

said input transducers in said acoustical paths being structurally identical, said output transducers in said acoustical paths being structurally identical, and said input and output transducers in each of said acoustical paths being spaced apart by the same distance;

one of said input transducers in said two acoustical paths and said output transducers in said two acoustical paths being electrically connected in phase opposition, and the other of said input transducers in said two acoustical paths and said output transducers in said two acoustical paths being electrically connected in phase; and said reflector structures in said two acoustical paths having substantially the same reflection performance, said reflector structure in one of said acoustical paths being shorter than said reflector structure in the other of said acoustical paths by $\lambda/2$, and said reflector structures in said two acoustical paths being disposed centrally between said input and output transducers, wherein $\lambda$ is a wavelength at a mean frequency of the filter.

2. The filter according to claim 1, wherein said transducers are SPUDTs.

3. The filter according to claim 1, wherein said reflector structures have electrode strips with widths, and said reflector structures are weighted by varying the widths of said electrode strips.

4. The filter according to claim 1, wherein said reflector structures have electrode strips, and said reflector structures are weighted by shifting positions of said electrode strips.

5. The filter according to claim 1, wherein said reflector structures have electrode strips with widths, and said reflector structures are weighted by a combination of varying the widths and shifting positions of said electrode strips.

6. The filter according to claim 1, wherein said reflector structures have electrode strips, and said reflector structures are weighted by omissions of said electrode strips.

* * * * *